United States Patent

Babany et al.

[15] 3,636,467

[45] Jan. 18, 1972

[54] FREQUENCY SYNTHESIZER WITH NUMERICALLY CONTROLLED SCANNING VOLTAGE

[72] Inventors: Lucien Babany, Blanc Mesnil; Antoine Poussin, Neuilly-sur-Seine, both of France

[73] Assignee: C.I.T. Compagnie Industrielle Des Telecommunications, Paris, France

[22] Filed: Mar. 13, 1969

[21] Appl. No.: 807,768

[30] Foreign Application Priority Data

Mar. 13, 1968 France ....................................143590

[52] U.S. Cl. ....................................................331/4, 331/19

[51] Int. Cl. ..........................................................H03b 3/04

[58] Field of Search ..............................................331/4, 19

[56] References Cited

UNITED STATES PATENTS

| | | |
|---|---|---|
| 3,375,461 | 3/1968 | Ribour et al. ..............................331/4 |
| 3,379,993 | 4/1968 | Berman ..................................331/19 |
| 3,391,348 | 7/1968 | Kohler....................................331/19 |
| 3,427,561 | 2/1969 | Hamer....................................331/19 |
| 3,449,690 | 6/1969 | Berman ..................................331/19 |
| 3,247,465 | 4/1966 | Schucht ..............................331/36 C |

*Primary Examiner*—John Kominski
*Attorney*—Craig, Antonelli & Hill

[57] ABSTRACT

Frequency synthesizer utilizing harmonic counting in which a designated indication of the desired frequency determines the steps of control voltage to be applied by means of a stepped voltage generator to the variable oscillator in control thereof in such a way that its frequency is advanced to the capture range of a phase discriminator providing fine control.

5 Claims, 3 Drawing Figures

FREQUENCY SYNTHESIZER WITH NUMERICALLY CONTROLLED SCANNING VOLTAGE

The invention relates to a frequency synthesizer in which a coarse control of the output frequency of a variable frequency oscillator is effected by a scanning circuit and in which a fine control of the output frequency is effect by a phase discriminator after the scanning circuit has brought the output frequency within the control range of the frequency discriminator.

Many frequency synthesizers in current use are of one of two principal types, namely synthesizers with variable range frequency dividers and synthesizers whose operation is based upon the counting of harmonics as the frequency is increased through a spectrum of frequencies.

In frequency synthesizers with variable range frequency dividers, a numerical device for setting the required output frequency may be arranged to adjust the range of the divider. During scanning of the output frequency, usually effected by the application of a sawtooth voltage to a variable capacitance diode of the oscillator, when an output of the divider approaches a required value, control of the output frequency passes to a control circuit including a phase discriminator.

In synthesizers wherein the counting of harmonics is used to seek a desired frequency within a spectrum of frequencies, a numerical device for setting the required output frequency may be arranged to interrupt scanning at a preselected frequency. At this frequency a predetermined relationship occurs between a quantity significant of the required output frequency which is set in the numerical device and a quantity stored in a counter which is arranged to count successive passages of the variable output frequency through the increasing harmonics of a reference frequency. Control of the output frequency then passes to a control circuit including a phase discriminator, which is connected to receive the variable output frequency via a modulation and filtering assembly.

When frequency scanning is effected by a sawtooth voltage, a generator is arranged to supply a voltage in the form of a linear ramp voltage extending between preselected maximum and minimum values. Such a generator usually has a stable position from which it is periodically displaced, thereafter returning to the stable position of its own volition. For example, if the stable state corresponds to the charge of a capacitor to a given voltage Vo, at the beginning of a sawtooth cycle the capacitor is abruptly discharged and slowly recharges itself. When synchronization commences, in the course of scanning, it does not stop the increase of the sawtooth voltage, and the generator continues to return to its stable position corresponding to the fully charged state of the capacitor. Thus, if the sawtooth voltage is applied, for example, to a variable capacitance diode, a voltage change across the diode after synchronization commences, unless a compensating voltage is also applied to it. If the phase discriminator begins to operate at an intermediate value $V_1$ of the sawtooth voltage, a continuous voltage must be provided to compensate the subsequent change in the excess voltage, which is initially $V_o - V_1$. This requirement tends to reduce the stability of the locked-on synchronization.

In operation, the phase discriminator may be required to supply the total polarization voltage of the variable capacitance diode, being the sum of the voltage produced by the scanning at which the phase discriminator begins to operate (this voltage is referred to as the capturing voltage) plus the voltage required from the discriminator for correction of slight instantaneous deviations. This is difficult to achieve at frequencies of 40 to 80 MHz. and becomes extremely difficult with higher frequencies of, for instance, 500, 1,000 or 4,000 MHz. Experience shows that the range of dephasing which can be detected under good conditions by a phase discriminator is not more than some 10ths of a radian. If the range to be covered is, for example, 4 to 5 GHz, a width of 1 GHz, a "loop gain" of several GHz per radian is required, which a high frequency oscillator is unable to provide with sufficient accuracy.

In accordance with the invention there is provided a frequency synthesizer including: a variable frequency oscillator adapted to have its output frequency varied in steps during scanning by a scanning circuit; a modulation and filter assembly connected to receive the output frequency and also a spectrum of harmonics of a high stability reference frequency, and arranged to provide beats between the output frequency and the harmonics; a counter connected to receive and store a quantity significant of the number of times a preselected value of beat frequency occurs in the modulation and filter assembly and thus significant of the number of coincidences between the output frequency of the oscillator and successive harmonics of the spectrum; a coincidence circuit arranged to compare the quantity stored in the counter with a second quantity significant of the output frequency of the oscillator; and connections extending from the coincidence circuit for preventing further scanning when the two quantities compared have a predetermined relationship.

The scanning circuit preferably includes a step voltage generator, a clock pulse generator, and an AND gate connected to transmit the clock pulses from the clock pulse generator to the step voltage generator.

The coincidence circuit suitably includes a coincidence register adapted to detect coincidence of the two quantities compared and arranged, on detection of such coincidence, to prevent further transmission of clock pulses through the AND gate.

The frequency synthesizer preferably includes a phase discriminator connected to receive the high stability reference frequency and also a preselected beat frequency of a beat between the output frequency of the oscillator and one of the harmonics, and arranged to apply a synchronization voltage to the variable frequency oscillator.

The frequency synthesizer is so arranged that the frequency to be synchronized is brought near enough to the reference frequency of the phase discriminator by the scanning circuit for the phase discriminator to have to compensate only small accidental deviations of the output frequency.

The frequency synthesizer is arranged to supply a scanning voltage and a synchronization voltage. Each of these may be applied to a respective separate variable capacitance diode, but the arithmetic sum of the two voltages is preferably applied to a single variable capacitance diode. The step voltage generator may be of any known type.

The invention will now be described in more detail, by way of example, with reference to the accompanying drawings, in which.

Figure 1:
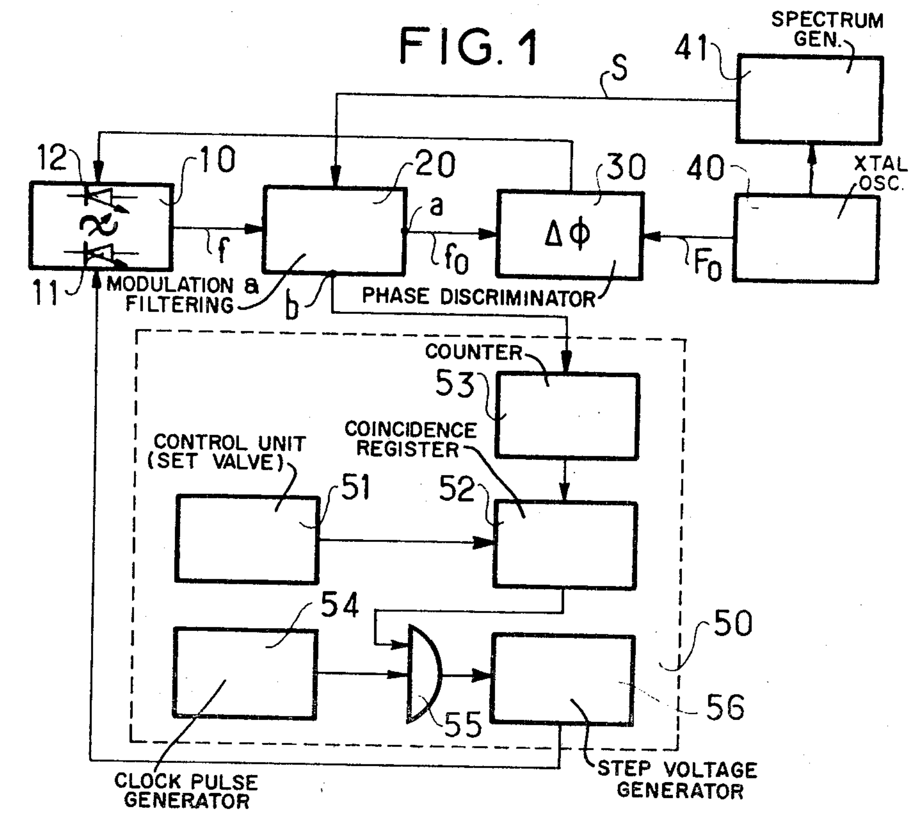
FIG. 1 is a schematic block diagram of a frequency synthesizer in accordance with the inventor.

Referring to FIG. 1, the frequency synthesizer includes a variable frequency oscillator 10 containing two variable capacitance diodes. A first variable capacitance diode 11 effects scanning of the frequency of the oscillator under the control of an element 50, and a second variable capacitance diode 12 effects synchronization of the output frequency of the oscillator 10 under the control of a phase discriminator 30. A modulation and filtering assembly 20 has two output terminals, *a* and *b*. From the terminal *a* a frequency is obtained which is formed by a preselected operation of the output frequency of the oscillator 10 and which is applied to the phase discriminator 30. In the synchronized state this frequency is $f_o$. A high stability oscillator 40 supplies a frequency $F_o$ to the phase discriminator 30. In the synchronized state, $f_o = F_o$. A generator 41 of a spectrum of harmonics is supplied with the frequency $F_o$ by the high stability oscillator 40, and its outer spectrum S is applied to the modulation and filtering assembly 20.

From terminal $b$ of the assembly 20 there are successively obtained, during frequency scanning of the oscillator 10, beats between the variable output frequency $f$ of the oscillator 10 and the components of the spectrum S. The synthesizer is so arranged that for any value of the frequency $f$ there is always in the spectrum S a frequency which enables the frequency $f$ to be transposed to $f_o$ by means of the assembly 20.

Arrangement 50 is provided to set the required value of the output frequency $f$. It includes a control unit 51 in which is selectively set a quantity significant of the frequency $f$ to be synthesized, and a coincidence register 52 to which is applied the quantity set in the control unit 51. A counter 53 is connected to receive and store a quantity significant of the number of times a preselected value of beat frequency is obtained in the assembly 20, i.e., it counts the beats resulting from the frequency $f$ sweeping the harmonic spectrum. The content of the counter 53 is compared with the quantity transmitted to the register 52 by the control unit 51.

A clock pulse generator 54 is connected to an input of an AND-gate 55 which is connected to receive at another input an inhibiting signal when it issues from the register 52. A step voltage generator 56 advances by one voltage step for each clock pulse received from the clock 54 via the AND-gate 55. The output of generator 56 is applied to the variable capacitance diode 11 contained in the oscillator 10.

The operation of the synthesizer shown in FIG. 1 is as follows: during frequency scanning effected by the step voltage applied to the variable capacitance diode 11 by generator 56, beats appear at terminal $b$ of the assembly 20, and the number of occurrences of a preselected value of beat frequency is counted by the counter 53. When the quantity stored in the counter 53 coincides with the quantity set in the coincidence register 52, the register transmits an inhibiting signal to the AND-gate 55 to prevent passage of further clock pulses through the gate to the generator 56. The generator is arranged to remain at the last step reached before AND-gate 55 is closed. At this moment the frequency obtained at terminal $a$ is near enough to the frequency $F_o$ for the phase discriminator 30 to effect a highly stable synchronization of the frequencies $f_o$ and $F_o$, by means of the variable capacitance diode 12 of the oscillator 10.

Figure 2:
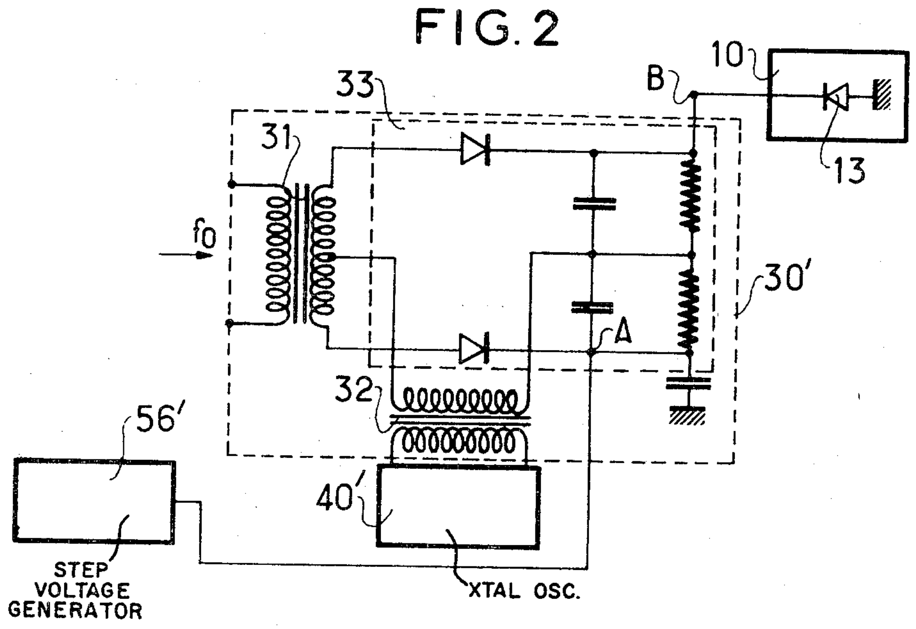
FIG. 2 is a simplified schematic circuit diagram of part of a modified form of the synthesizer in accordance with the invention.
Figure 3:
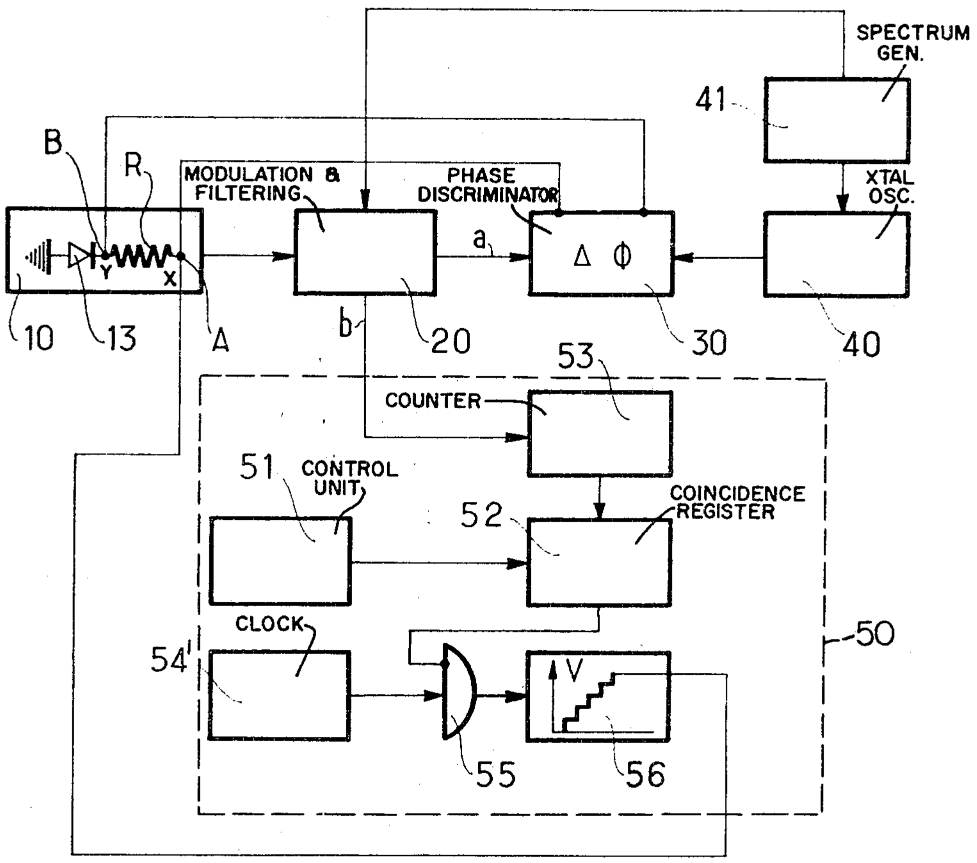
FIG. 3 shows a modified form of the synthesizer shown in FIG. 1, in which a single variable capacitance diode is used.

The two separate variable capacitance diodes of the synthesizer shown in FIG. 1 can be replaced by a single diode, as shown in FIGS. 2 and 3. Elements of the synthesizers which are common to all the Figures are similarly referenced.

Referring to FIG. 2, the phase discriminator 30 includes a transformer 31 for connecting to the modulation and filtering assembly 20, a transformer 32 for connecting to the oscillator 40, a differential detection network 33 which has a "low" output terminal A, and a "high" output terminal B connected to a variable capacitance diode 13 contained in the variable oscillator 10.

The step voltage generator 56 applies its output or capturing voltage to the terminal A. The synchronization voltage from the phase discriminator is applied at B. The voltage at the point B is thus the sum of the capture voltage supplied by generator 56 and the synchronization voltage. Control of the variable oscillator is thus obtained with a single variable capacity diode, and the range of detectable dephasing required in the phase discriminator is only that which is needed to compensate small instantaneous deviations of the output frequency. The operation of the circuitry shown in FIGS. 2 and 3 will now be described with reference to FIG. 3.

Referring to FIG. 3, control box 51 is adjusted to set a quantity significant of a required frequency, which may be expressed in decimal notation as the value *pqrst*, for example. This value is transmitted to and is recorded in the coincidence register 52. The generator 56 supplies a voltage V which starts at 0 voltage and advances by one step for each clock pulse received from the clock 54. When the quantities indicated in counter 53 and register 52 coincide, and inhibiting signal is applied to AND-gate 55 to block the arrival of further clock pulses at the generator 56, which is arranged to maintain the voltage produced at the last step. The step voltage V is applied to one terminal X of a resistance R with terminals XY. The synchronization voltage supplied by the phase discriminator 30 is also applied between the terminals X and Y of the resistance R, and is relatively low since the step voltage V has brought the output frequency close to the required value *pgrst*, so enabling good stability of synchronization to be obtained. The sum of the voltages at the point Y is applied to the single variable capacitance diode 13.

We have shown and described several embodiments in accordance with the present invention. It is understood that the same is not limited thereto but is susceptible of numerous changes and modifications as known to a person skilled in the art and we, therefore, do not wish to be limited to the details shown and described herein, but intend to cover all such changes and modifications as are obvious to one of ordinary skill in the art.

What we claim is:

1. A frequency synthesizer including: a variable frequency oscillator providing an output frequency; scanning means for continuously applying a control signal to said variable frequency oscillator including means for varying said control signal so as to vary the frequency of said oscillator in steps, said scanning means comprising a step voltage generator and a clock pulse generator: a modulation and filter assembly connected to receive said output frequency from said oscillator; generator means providing a spectrum of harmonics of a high stability reference frequency connected to said modulation and filter assembly to provide beats between said output frequency and said harmonics; a counter connected to the output of said modulation and filter assembly to receive and store a quantity significant of the number of times a preselected value of beat frequency occurs in the modulation and filter assembly indicative of the number of coincidences between said output frequency of said variable oscillator and successive harmonics of the spectrum; coincidence circuit means connected to the output of said counter to compare the quantity stored in the counter with a second quantity significant of the desired output frequency of the oscillator; and control means extending from said coincidence circuit to said scanning means for inhibiting said means for varying said control signal to thereby prevent further scanning when the two quantities compared in said coincidence circuit means have a predetermined relationship, said control means including an AND-gate connected to transmit the clock pulses from the clock pulse generator to the step voltage generator.

2. A frequency synthesizer as claimed in claim 1, in which said coincidence circuit means includes coincidence register means responsive to coincidence of the quantities compared for generating an inhibit signal to prevent further transmission of clock pulses through said AND gate.

3. A frequency synthesizer as claimed in claim 1, including a stable oscillator and a phase discriminator connected to said stable oscillator to receive the high stability reference frequency therefrom and connected to said modulation and filtering arrangement to receive a preselected beat frequency of a beat between the output frequency of said variable oscillator and one of the harmonics of said spectrum, and having its output connected to apply a synchronization voltage to the variable frequency oscillator.

4. A frequency synthesizer as claimed in claim 3, in which the variable frequency oscillator includes a single variable capacitance diode connected to receive a signal representing the sum of a scanning voltage from said scanning means and said synchronization voltage from said phase discriminator.

5. A frequency synthesizer as claimed in claim 2 wherein said coincidence register means includes a settable control unit providing a signal representing a frequency value and a coincidence circuit having first and second inputs and providing said inhibit signal at an output upon detection of coincidence between the signals received at said first and second inputs, said settable control unit being connected to said first input and said counter being connected to said second input of said coincidence circuit.